(12) United States Patent
Ho et al.

(10) Patent No.: US 6,363,508 B1
(45) Date of Patent: Mar. 26, 2002

(54) METHOD FOR TESTING REFLECTION LCD PROJECTOR AND DISPLAY PANEL PIXEL AREA THEREOF

(75) Inventors: Yung-Yuan Ho; Chia-Yuan Chang; Nang-Ping Tu, all of Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/436,689

(22) Filed: Nov. 8, 1999

(30) Foreign Application Priority Data

Jun. 5, 1999 (TW) ........................................ 88109349 A

(51) Int. Cl.[7] .............................................. G06F 11/00
(52) U.S. Cl. ........................................ 714/736; 386/165
(58) Field of Search ................................ 714/736, 738, 714/819; 382/165, 174, 194; 349/73, 74, 108, 113

(56) References Cited

U.S. PATENT DOCUMENTS

| | | | | |
|---|---|---|---|---|
| 5,621,467 A | * | 4/1997 | Chien et al. ................. | 348/409 |
| 5,936,687 A | * | 8/1999 | Lee ............................... | 349/40 |
| 6,023,538 A | * | 2/2000 | Noguchi et al. ............. | 382/312 |
| 6,144,426 A | * | 11/2000 | Yamazaki et al. ........... | 349/95 |

* cited by examiner

*Primary Examiner*—Christine T. Tu
(74) *Attorney, Agent, or Firm*—Darby & Darby

(57) ABSTRACT

A method of testing a reflection-type LCD projector is disclosed. The present invention provides a method of testing the digital-circuit portion of the data drivers of the silicon wafer LCD of the reflection-type LCD projector, and a method of testing the panel pixel area of the silicon wafer LCD display. The present invention can be applied to LCD display panels manufactured by CMOS process and poly-silicon thin film transistor process for the benefits of helping to resolve manufacturing issues during the development stage, thereby shortening the required production time schedule, and reducing the production cost.

13 Claims, 11 Drawing Sheets

METHOD FOR TESTING REFLECTION LCD PROJECTOR AND DISPLAY PANEL PIXEL AREA THEREOF

BACKGROUND OF THE INVENTION

1. Field of the Invention

The present invention relates to a method for testing a reflection-type LCD projector. More specifically, it relates to a method for testing the digital-circuit portion of the data driver of the silicon wafer LCD of a reflection-type LCD projector, and a method for testing the panel pixel area of the silicon wafer LCD display of a reflection-type LCD projector.

2. Description of Related Art

At present, the silicon wafer liquid crystal display, which is manufactured by CMOS fabrication process, is applied to the reflection-type LCD projector. The silicon wafer liquid crystal display is characterized by integrating data drivers, scan drivers, and the pixel area onto a single insulating substrate by making the best of the high electronic mobility of the CMOS process. The structure of the silicon wafer liquid crystal display (LCD) is illustrated in FIG. 1.

For a reflection-type LCD projector using a silicon wafer liquid crystal display (or silicon wafer LCD hereafter) to project images onto a screen, its fabrication must integrate technologies including applied circuit design, driver IC (integrated circuits) design, photo-etching of patterned electrodes, filling of liquid crystals, packaging, and mounting of a back-light assembly, etc. Therefore, the silicon wafer LCD is a complicated product that relies on a highly coordinated manufacturing process. If the fabricated driver ICs can not be adequately and reliably tested, then the following steps for filling the LCD module with liquid crystals, packaging, and mounting back-light assembly can not be carried out. When the silicon wafer LCD fails to function properly during the final stages of manufacturing, then the subsequent process of debugging and reworking will prove to be costly and the real problems can not be identified and resolved. For a profit-seeking manufacturer, the subsequent waste of labor and material during mass-production stage, to fill liquid crystals, packaging, and mount back-light assembly will in time become costly.

The conventional method for testing the pixel area of the TFT-LCD panel includes a method that involves CCD image contrasting. When applying the CCD contrasting method, the panel is first back-lighted by a lighting source. The CCD device then takes an image of the pixels on the display panel, converts the image into digital data, and finally compare the data in contrast to the controlled sets of data in order to find pixel defects appearing on the display panel. However, the above described method only apply to conventional LCD manufacturing process where data drivers, scan drivers, and display panel are each fabricated and tested separately.

However, a CMOS silicon wafer LCD is an integrated device of data drivers, scan drivers, and display panel. Therefore, in order to apply the CCD image contrasting method on testing the CMOS silicon wafer LCD, the above mentioned manufacturing process of filling of liquid crystals and mounting of driver ICs and back-light assembly has to be completed before a test can be carried out. The need for a silicon wafer LCD module to be fully assembled before a functional test can be administered makes the CCD image contrast test impractical and uneconomical.

As shown in FIG. 1, the three main components to be tested on a silicon wafer LCD are the scan drivers, the data drivers, and the pixel area. Among them, the test implemented on the scan drivers only compares the input and output signals in series. The crucial task, then, is to find highly reliable and efficient testing methods for each of the data drivers and the pixel area components.

SUMMARY OF THE INVENTION

Accordingly, it is the object of the present invention to provide a highly reliable and efficient testing method for a CMOS silicon wafer LCD in a reflection-type LCD projector for the purpose of mass-production, and research and development.

A first testing method for testing the digital-circuit portion of data drivers of a silicon wafer LCD comprises the following steps:

Provide the first and the second test patterns. The first test pattern has 2n bits of digital data $P_1 \sim P_{2n}$ where $P_{2j-1}=0$, $P_{2j}=1$, and $1 \leq j \leq n$. The second test pattern has 2n bits of digital data $Q_1 \sim Q_{2n}$ where $Q_{2j-1}=0$, $Q_{2j}=1$.

The digital data of the first test pattern are inputted to the digital-circuit portion, and the 2n digital data are processed and outputted by the digital-circuit portion, thereby obtaining 2n bits of a first processed data $Pr_1 \sim Pr_{2n}$. Every value of $P_1$, $P_3$, $\sim P_{2n-1}$ processed by the digital-circuit portion is assigned to each of the respective $Pr_{2j-1}$, while every value of $P2$, $2_4$, $\sim P2n$ processed by the digital-circuit portion is assigned to each of the respective $Pr_{2j}$.

The digital data of the second test pattern are inputted to the digital-circuit portion, and the 2n digital data are processed and outputted by the digital-circuit portion, thereby obtaining 2n bits of a second processed data $Qr_1 \sim 1\ Qr_{2n}$. Every value of $Q_1$, $Q_3$, $\sim Q_{2n-1}$ processed by the digital-circuit portion is assigned to each of the respective $Qr_{2j-1}$, while every value of $Q_2$, $Q_4$, $\sim Q_{2n}$ processed by the digital-circuit portion is assigned to each of the respective $Qr_{2j}$.

Consequently, both a first and second testing apparatus are provided; the first testing apparatus accepts a first specific value and the first processed data $Pr_1 \sim Pr_{2n}$ while the second testing apparatus accepts a second specific value and the second processed data $Qr_1 \sim Qr_{2n}$. If the first and second testing apparatuses output the first and second specific values respectively, then the digital-circuit portion processes the first and second test patterns without any error.

A second testing method for testing the display panel pixel area of a silicon wafer LCD that has M scan-lines with N pixel units located on each of the scan-lines to detect damaged pixels comprises the following steps:

(1) Divide the N pixels (data lines) into K pixel groups. Provide a group-data parallel-in series-out device. Provide a first test pattern of data length K, which is formed by outputting a first-type data and a second-type data alternately. Provide a second test pattern of data length K which is complementary to the first test pattern.

(2) Selecting one of the M scan-lines, write the first test pattern of data length K into K corresponding pixel group; wherein each pixel within the same pixel group is written with the same data value, and the N pixel units located on the selected scan-line are written with the K data of the first test pattern.

Input, in parallel, the data written into the N pixel units to the group-data parallel-in series-out device; wherein the group-data parallel-in series-out device processes the data written into every pixel within each of the K pixel groups and outputs a first processed outcome with a data length K. Complete the data output of the first processed outcome, in series, after K time cycles.

(3) Write the K data of the second test pattern into the K pixel groups respectively; where each pixel within the same pixel group has the same data, and the N pixels are written with the K data of the second test pattern.

Input, in parallel, the data written into the N pixel units to the group-data parallel-in series-out device; wherein the group-data parallel-in series-out device processes the data written into every pixel unit within each of the K pixel groups and outputs a second processed outcome with a data length K. Complete the data output of the second processed outcome, in series, after K time cycles.

(4) Repeat the above steps (2) and (3) until all of the M scan-lines are tested completely; wherein, when each of the M scan-lines is tested according the above steps, the first test pattern is contrasted with the first processed outcome while the second test pattern is contrasted with the second processed outcome in order to detect any damaged pixels.

BRIEF DESCRIPTION OF THE DRAWINGS

Other objects, features, and advantages of the present invention will become apparent from the following detailed description of the preferred but non-limiting embodiment. The description is made with reference to the accompanying drawings in which:

FIG. 5 schematically illustrates the structure of the first test apparatus 23a;

DETAILED DESCRIPTION OF THE PREFERRED EMBODIMENT

Figure 1:
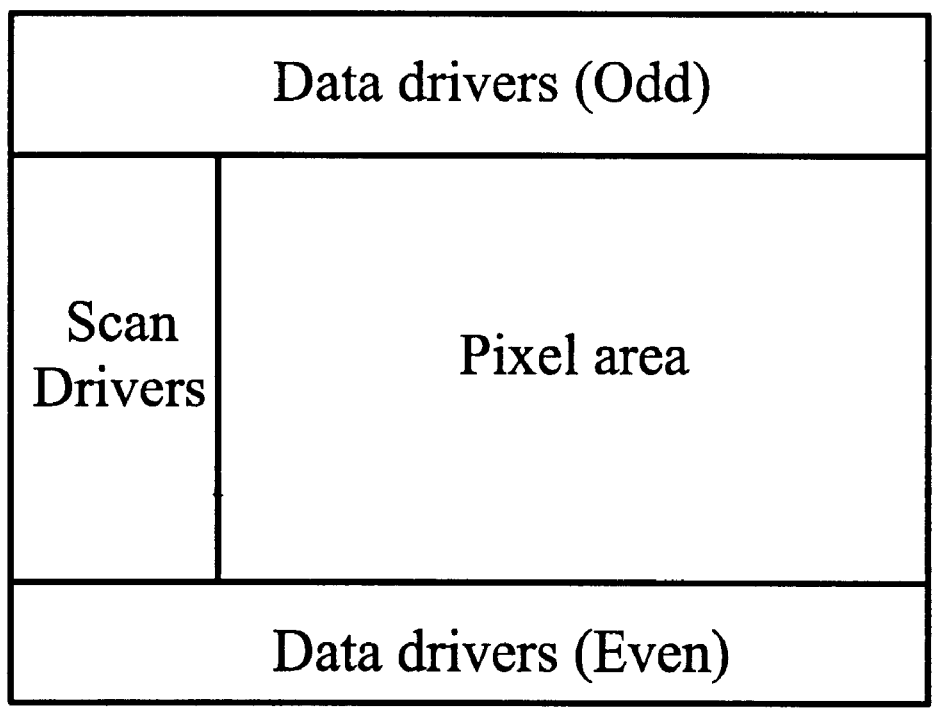
FIG. 1 illustrates the structure of a silicon wafer liquid crystal display.
Figure 2:
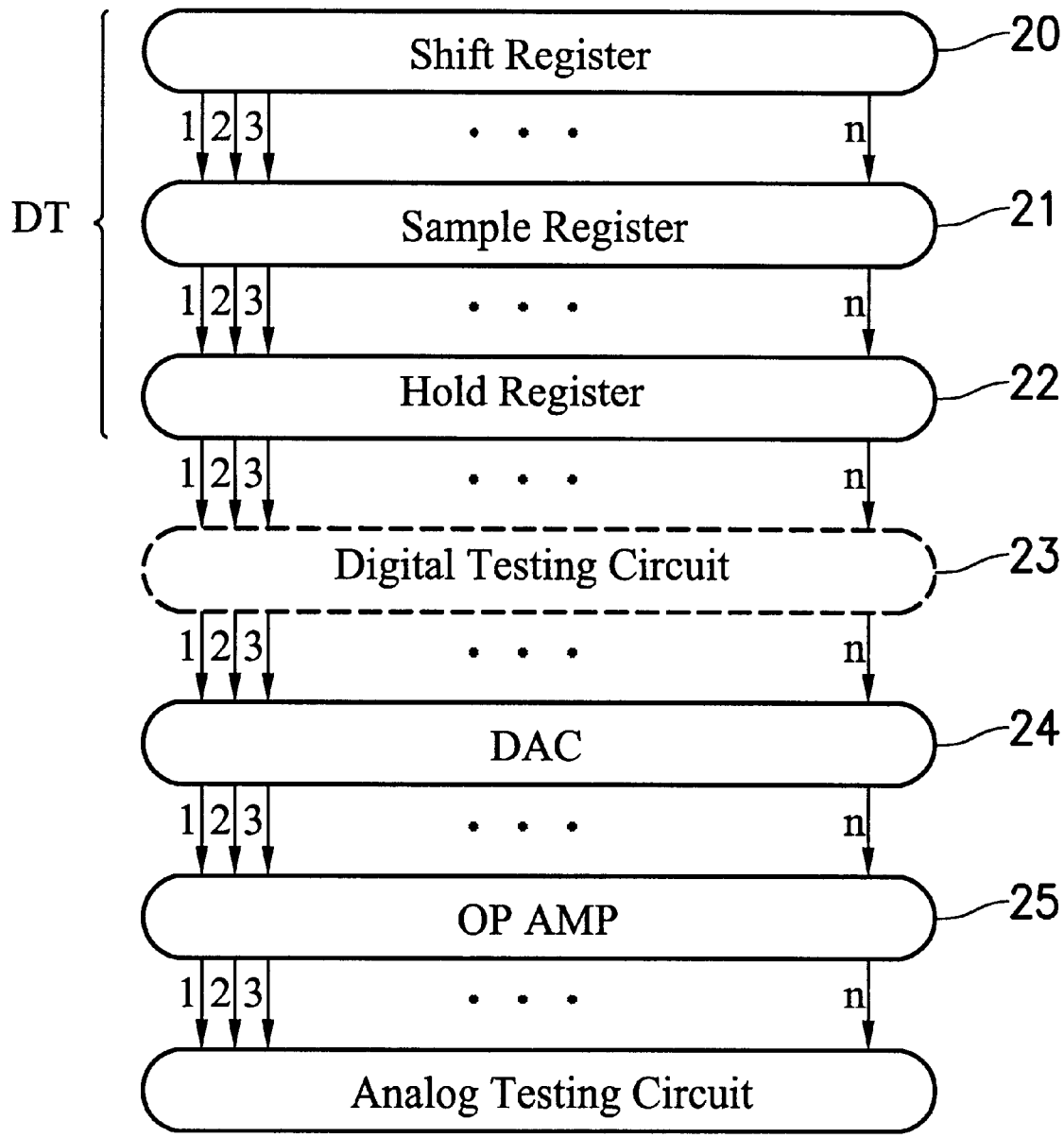
FIG. 2 schematically illustrates the structure of a data driver.

The following are preferred embodiments according to the present invention that describe a testing method for the CMOS silicon wafer LCD data driver as well as a testing method for the display panel pixel area.
EMBODIMENT I: Method for Testing the Digital-circuit Portion of the Data Driver As shown in FIG. 2 (without the Digital testing circuit 23), the general structure of a conventional data driver comprises at least the following units: a shift register 20, a sample register 21, a hold register 22, a DAC (Digital-to-Analog Converter) 24, an OP AMP (operational amplifier) 25, etc. The data driver contains both analog and digital circuits; nevertheless, the present invention is specifically designed for testing the digital-circuit portion DT.

With regard to the digital-circuit portion of the data driver, the shift register 20, sample register 21, and the hold register 22 all have iterative characteristics; the digital-circuit portion is thus a typical iterative logic circuit. Consequently, the present invention discloses a method of error detection, specifically for the digital-circuit portion of the data driver. The testing method according to the present invention is carried out in conjunction with less testing circuits, thereby reducing the cost for testing. As shown in the data driver structure of FIG. 2, there is an additional digital testing circuit 23 provided between the digital-circuits portion DT and the DAC 24 such that the testing method according to the present invention can be carried out.

Table 1 is a tabulation of the failure analysis statistics obtained after the LCD passes through the stages of design, production, and testing without utilizing the digital testing circuit 23.

As shown in Table 1, the failure for the shift register 20 is about 8.2%; the error detection of the shift register 20 is done by checking the serial output signal of the shift register 20. If the data driver structure of FIG. 2 is tested without the digital testing circuit 23, then all four different circuits of the sample register 21, hold register 22, DAC 24, and OP AMP 25 will be tested. However, the combined percentage failure for all of the four circuit tests can be as high as 91.8%.

TABLE 1

STATISTICS OF CIRCUIT DEFECT OCCURRING LOCATIONS

| CIRCUIT DEFECT OCCURRING LOCATIONS | | PERCENTAGE SHARE AMONG ALL CIRCUIT DEFECTS |
|---|---|---|
| Shift register | | 8.2% |
| Sample register | + | 91.8% |
| Hold register | + | |
| DAC | + | |
| OP AMP | | |

Consequently, it is difficult to accurately locate and distinguish the essential points of the 91.8% failure rate; for instance, the failure could be caused by the DAC 24, or it could be caused by circuits before the DAC 24.

The data outputted from the shift register 20 is processed by the sample register 21, the hold register 22, the DAC 24, and the OP AMP 25. Then the OP AMP 25 outputs an analog signal. In order to sample the analog signal for analyzing, an additional step for using a low-frequency horizontal synchronization (Hsync) signal as a sampling frequency signal is required, and thus the testing time is increased inevitable.

In order to accurately point out the cause of the failure, or fault, reduce the cost of testing and production, and expand the logic fault coverage of testing, the present invention discloses a digital testing circuit 23 which is designed specifically for testing the digital-circuit portion of the data driver.

Figure 3:
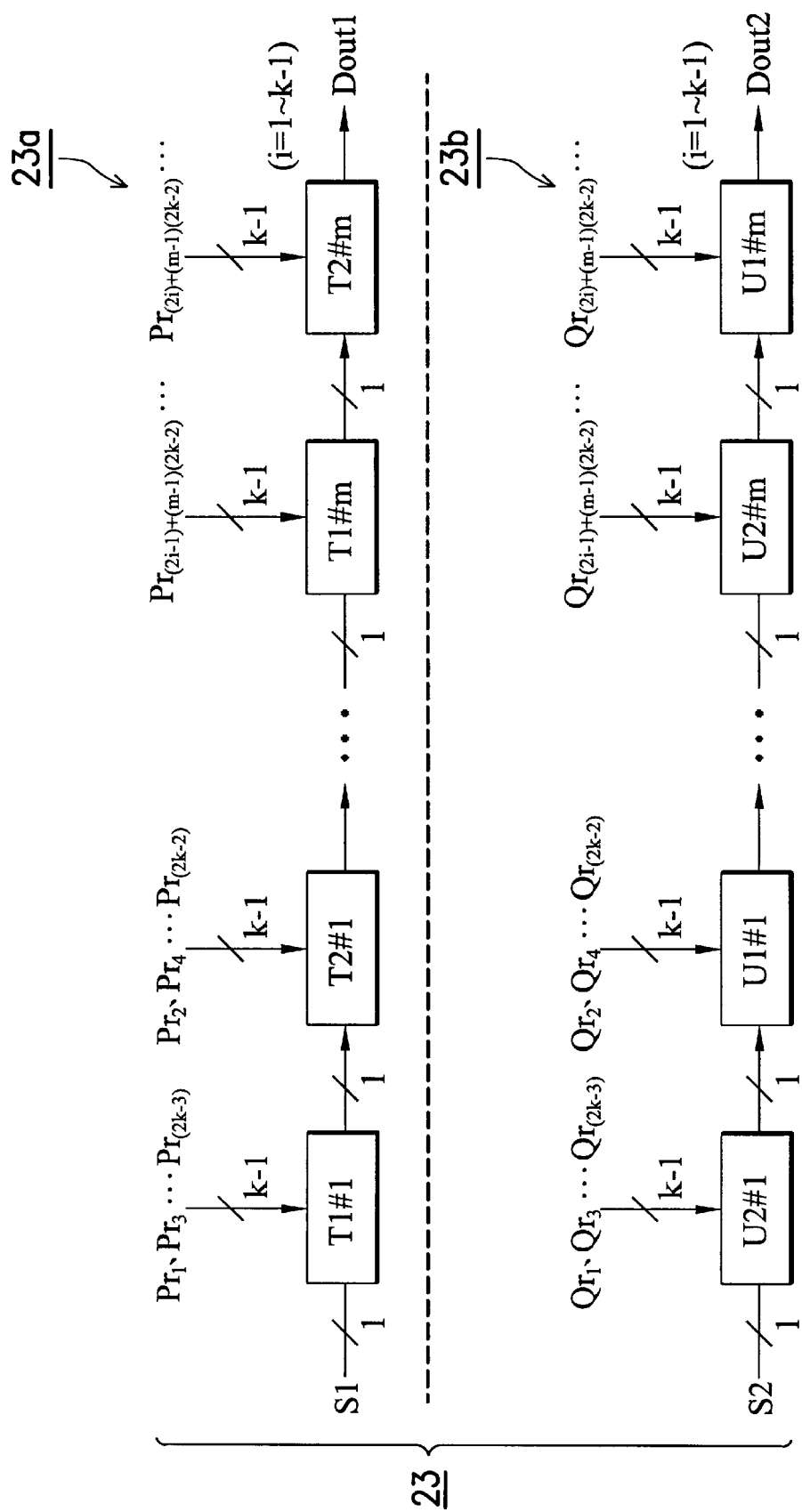
FIG. 3 schematically illustrates the structure of a circuit-testing apparatus 23.

The testing method carried out in conjunction with the digital testing circuit 23 depicted in FIG. 3, is described in detail hereinafter.

The testing method comprises the following steps:

First, provide a first test pattern which has 2n bits of digital data $P_1 \sim P_{2n}$ where $P_{2j-1}=0$, $P_{2j}=1$, and $1 \leq j \leq n$.

Second, provide a second test pattern which has 2n bits of digital data $Q_1 \sim Q_{2n}$ where $Q_{2j-1}=1$, $Q_{2j}=0$, and $1 \leq j \leq n$.

Next, input the digital data of the -first test pattern $(P_1 \sim P_{2n})$ to the digital-circuit portion DT of the data driver. The digital-circuit portion DT outputs a first processed data $(Pr_1 \sim Pr_{2n})$ of 2n bits. The value of each of the first processed data $Pr_1$, $\sim Pr_{2j-1}$ is selected respectively from one of the values of the different data $P_1$, $P_3$, $\sim P_{2n-1}$ after being processed.

Then, input the digital data of the second test pattern $(Q_1 \sim Q_{2n})$ to the digital-circuit portion DT of the data driver. The digital-circuit portion DT outputs a second processed data $(Qr_1 \sim Qr_{2n})$ of 2n bits. The value of each of the second processed data $Qr_1, \sim Qr_{2j-1}$ is selected respectively from one of the values of the different data $P_1, P_3, \sim P_{2n-1}$ after being processed.

Provide the digital testing circuit 23, which is composed by a first testing apparatus 23a and a second testing apparatus 23b, as depicted in FIG. 3. The first testing apparatus 23a receives a first specific value S1 and the first processed data $Pr_1 \sim Pr_{2n}$; the second testing apparatus 23b receives a second specific value S2 and the second processed data $Qr_1 \sim Qr_{2n}$.

The first testing apparatus 23a comprises m first-type testers T1#1~T1#m, and m second-type testers T2#1~T2#m, alternately connected to each other in series. Each of the first-type and second-type testers has k input terminals, where mx (k−1)=n.

Further, the first input terminal of the first-type tester T1#1 is coupled to the first specific value S1, and the output of the first-type tester T1#1 is coupled to the first input terminal of the second-type tester T2#1. The first input terminal of the $y^{th}$ ($2 \leq y \leq m$) first-type tester (T1#y) is coupled to the output of the $(y-1)^{th}$ second-type tester (T2# (y−1)), and the output of the $y^{th}$ first-type tester (T1#y) is coupled to the first input terminal of the $y^{th}$ second-type tester (T2#y) The rest of the (k−1) input terminals of each of the first-type testers (T1#1~T1#m) then selectively receives (k−1) different $Pr_{2j-1}$ data from the respective first processed data, and the rest of the (k−1) input terminals of each of the second-type tester (T2#1~T2#m) then selectively receives (k−1) different $Pr_{2j}$ data from the respective first processed data.

Similarly, the second testing apparatus 23b comprises m first-type testers U1#1~U1#m, and m second-type testers U2#1~U2#m, alternately connected to each other in series. Each of the first-type and second-type testers has k input terminals, where mx (k−1)=n.

Further, the second input terminal of the second-type tester U2#1 is coupled to the second specific value S2, and the output of the second-type tester U2#1 is coupled to the first input terminal of the first-type tester U1#1. The first input terminal of the $y^{th}$ ($2 \leq y \leq m$) second-type tester (U2#y) is coupled to the output of the $(y-1)^{th}$ first-type tester (U1# (y−1)), and the output of the $y^{th}$ second-type tester (U2#y) is coupled to the first input terminal of the $y^{th}$ first-type tester (U1#y). The rest of the (k−1) input terminals of each of the second-type testers (U2#1~U2#m) then selectively receives (k−1) different data from the respective second processed data $(Qr_{2j-1})$, and the rest of the (k−1) input terminals of each of the first-type tester (U1#1~U1#m) then selectively receives (k−1) different data from the respective second processed data $(Qr_{2j})$ The first specific value S1 and the second specific value S2 are selectively inputted to the first testing apparatus 23a or the second testing apparatus 23b according to the test pattern selected.

The following describes the method for testing the digital-circuit portion DT of the data driver in detail, and the method is divided into two separate test patterns for clarity.

1. The First Test Pattern

The first test pattern $(P_1 \sim P_{2n}, n=16)$ contains 32-bit digital data $(P_1 \sim P_{32})$, where $P_{2j-1}=0$, $P_{2j}=1$, and $1 \leq j \leq 16$, so the first test pattern has the form of $[P_1 P_2 P_3 P_4 \ldots P_{31} P_{32}]=[0\ 1\ 0\ 1\ \ldots\ 0\ 1]$.

Figure 4:
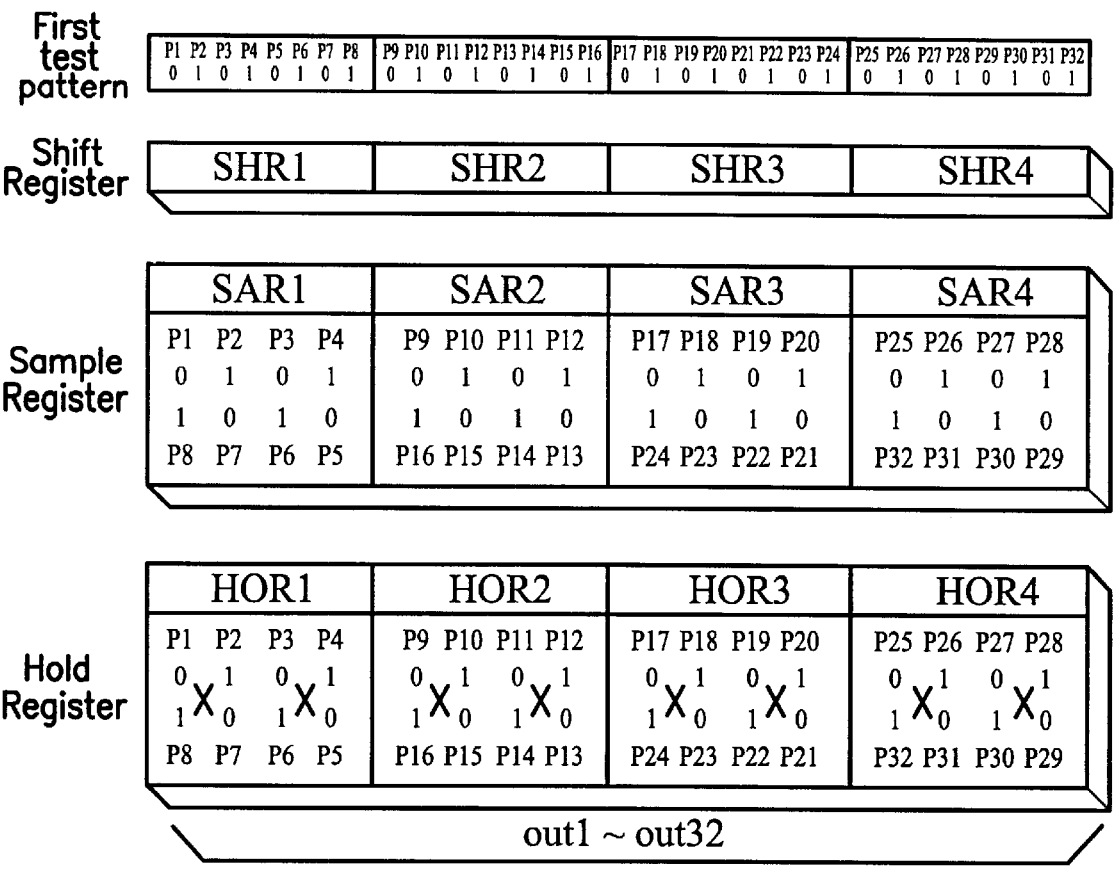
FIG. 4 schematically illustrates the structure of a first testing method of the present invention.
Figure 4:
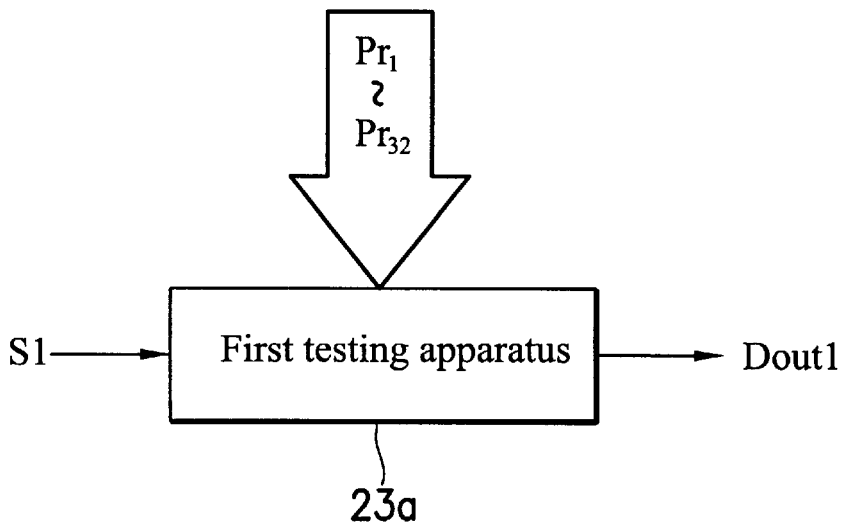

Referring to FIG. 4, the above first test pattern $[P_1 P_2 P_3 P_4 \ldots P_{31} P_{32}]$ is equally divided into four sets of data, $[P_1 \sim P_8], [P_9 \sim P_{16}], [P_{17} \sim P_{24}]$, and $[P_{25} \sim P_{32}]$. Then these four sets of data are to be processed by four shift registers (SHR1~SHR4) four sample registers (SAR1~SAR4), and four hold registers (HOR1~HOR4) separately (i.e. processed by the digital-circuit portion of the data driver), in such a way that the first processed data $[Pr_1 Pr_2 Pr_3 Pr_4 \ldots Pr_{31} Pr_{32}]$ are outputted from the output terminals (out1~out32) of the hold registers (HOR1~HOR4). Consequently, the circuit layout and/or test pattern can be arranged in such a way that each of the processed data $(Pr_1, Pr_3, Pr_5, \ldots Pr_{29}, Pr_{31})$ outputted via the odd-numbered output terminals of the hold registers (out1, out3, out5, ... out29, out31) corresponds to one of the different odd-numbered input data $P_{2j-1}$, where $1 \leq j \leq 16$, of the first test pattern after being processed. By the same token, the circuit layout and/or test pattern can be arranged in such a way that each of the processed data $(Pr_2, Pr_4, Pr_6, \ldots Pr_{30}, Pr_{32})$ outputted via the even-numbered output terminals of the hold registers (out2, out4, out6, ... out30, out32) corresponds to one of the different even-numbered input data $P_{2j}$, where $1 \leq j \leq 16$, of the first test pattern after being processed.

In the present embodiment, the $[P_1 P_8 P_7 P_2 P_3 P_6 P_5 P_4]$ data, after being processed, serve as the processed data $Pr_1 \sim Pr_8$ outputted via the output terminals out1~out8, respectively; the $[P_9 P_{16} P_{15} P_{10} P_{11} P_{14} P_{13} P_{12}]$ data, after being processed, serve as the processed data $Pr_9 \sim Pr_{16}$ outputted via the output terminals out9~out16, respectively; the $[P_{17} P_{24} P_{23} P_{18} P_{19} P_{22} P_{21} P_{20}]$ data, after being processed, serve as the processed data $Pr_{17} \sim Pr_{24}$ outputted via the output terminals out17~out24, respectively; and the $[P_{25} P_{32} P_{31} P_{26} P_{27} P_{30} P_{29} P_{28}]$ data, after being processed, serve as the processed data $Pr_{25} \sim Pr_{32}$ outputted via the output terminals out25~out32.

Accordingly, the first testing apparatus 23a receives inputs of both the first processed data $[Pr_1 Pr_2 Pr_3 Pr_4 \ldots Pr_{31} Pr_{32}]$ and the first specific value Sl, and it then outputs processed data Dout1.

Figure 5:
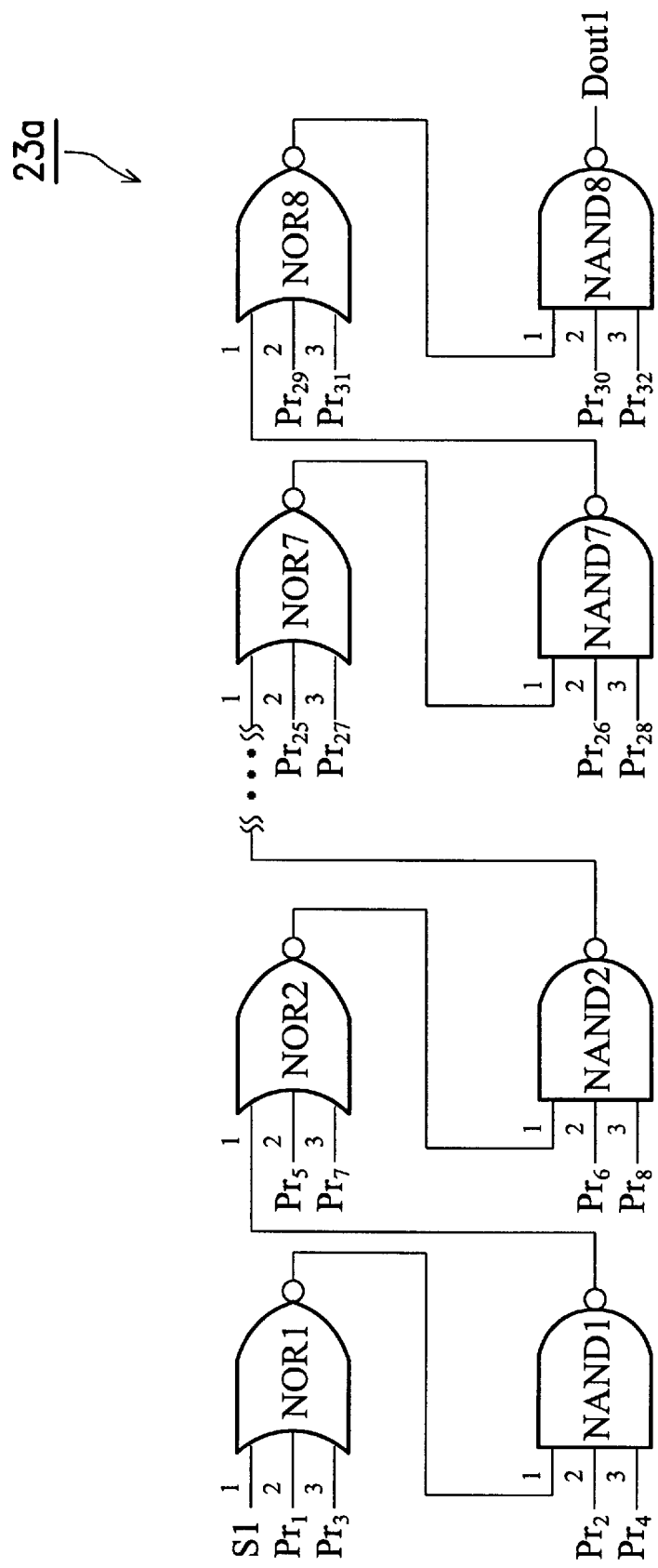

Referring to FIG. 5, in this embodiment the first testing apparatus 23a comprises eight NOR gates and eight NAND gates alternately interconnecting with each other in series. The eight NOR gates (NOR1~NOR8) are logic devices serving as the first-type testers (T1#1~T1#8, m=8); every NOR gate has three input terminals and one output terminal. Further, the eight NAND gates (NAND1~NAND8) are logic devices serving as the second-type testers (T2#1~T2#8); every NAND gate has three input terminals and one output terminal.

The second and third input terminals of each of the NOR gates (NOR1~NOR8) receive the first processed data $(Pr_1, Pr_3), (Pr_5, Pr_7), \ldots (Pr_{29}, Pr_{31})$ respectively; the second and third input terminals of each of the NAND gates (NAND1~NAND8) receives the first processed data $(Pr_2, Pr_4), (Pr_6, Pr_8), \ldots (Pr_{30} Pr_{32})$ respectively.

If the first test pattern $[P_1 P_2 P_3 P_4 \ldots P_{31} P_{32}]$, which has been processed by the digital-circuit portion DT (i.e. shift register, sample register, and hold register), does not produce any error during the process, then none of the data will be changed throughout the process.

From above descriptions, the data $[P_1 P_8 P_7 P_2 P_3 P_6 P_5 P_4]$ after being processed are outputted via out1~out8 output terminals and serve as the first processed data $Pr_1 \sim Pr_8$; the data $[P_9 P_{16} P_{15} P_{10} P_{11} P_{14} P_{13} P_{12}]$ after being processed are outputted via out9~out16 output terminals and serve as the first processed data $Pr_9 \sim Pr_{16}$; the data $[P_{17} P_{24} P_{23} P_{18} P_{19} P_{22} P_{21} P_{20}]$ after being processed are outputted via out17~out24 output terminals and serve as the first processed data $Pr_{17} \sim Pr_{24}$; and the data $[P_{25} P_{32} P_{31} P_{26} P_{27} P_{30}$ $P_{29}$ $P_{28}$] after being processed are outputted via out25~out32 output terminals and serve as the first processed data $Pr_{25}$~$Pr_{32}$. Therefore, if the digital-circuit portion DT processes the first data pattern without any error, then the value of the first processed data [$Pr_1$ $Pr_2$ $Pr_3$ $Pr_4$ . . . $Pr_{31}$ $Pr_{32}$] outputted by terminals out1~out32 of the hold registers (HOR1~HOR4) should be [0 1 0 1 . . . 0 1], the same as the first data pattern, where $Pr_{2j-1}$=0 and $Pr_{2j}$=1 ($1 \leq j \leq 16$).

Consequently, the first NOR gate (NOR1) would receive the first specific value S1 (the value S1 is "0" in this embodiment) and the first processed data [$Pr_1$, $Pr_3$] then output the value "1"; the first NAND gate (NAND1) would receive the value "1" outputted by NOR1 and the data [$Pr_2$, $Pr_4$] then output the value "0". In a like manner, when the eighth NOR gate (NOR8) receives the value "0" outputted by NAND7 and the processed data [$Pr_{29}$, $Pr_{31}$], it will then output a value "1", and when the eighth NAND gate (NAND8) receives the value "1" outputted by NOR8 and the value [$Pr_{30}$, $Pr_{32}$], it will then output a value "0". As a result, if no error is produced or generated by the processing of the digital-circuit portion DT, then the output data value Dout1 of the first testing apparatus 23a should be "0".

On the other hand, if, during the operating process of the digital-circuit portion DT, an error is generated in that at least one data value of the first test pattern [$P_1$ $P_2$ $P_3$ $P_4$ . . . $P_{31}$ $P_{32}$] has been changed, for example, a certain $P_{2j-1}$ changes its value from "0" to "1" or a certain $P_{2j}$ changes its value from "1" to "0", then the output Dout1 of the first testing apparatus 23a would not have been "0" but "1". Thus, the error caused by the digital-circuit portion DT can be detected.

Another example of an error caused by the digital-circuit portion DT would be that when $P_{26}$ changes its value from "1" to "0"; since $Pr_{25}$~$Pr_{32}$ are the processed data of [$P_{25}$ $P_{32}$ $P_{31}$ $P_{26}$ $P_{27}$ $P_{30}$ $P_{29}$ $P_{28}$] outputted via output terminals Out25~out32, $Pr_{28}$ also changes its value from "1" to "0", corresponding to $P_{26}$. Because there is no error generated at $Pr_1$~$Pr_{27}$, the output value of NOR1~NOR7 will all be "1" and the output value of NAND1~NAND6 will all be "0" after the first testing apparatus 23a receives the first specific value S1="0". Then, the gate NAND 7 receives both the output value "1" from the gate NOR7 and the first processed data $Pr_{26}$ and $Pr_{28}$ ("1" and "0", respectively), so the output of NAND7 becomes "1" which, in turn, makes the output of NOR8 "0". The final output of the gate NAND 8 then becomes "1" as a consequence. Since the output Dout1, of the first testing apparatus 23a, of value "1" does not equal the first specific value Si of value "0", the error generated by the digital-circuit portion can be detected.

Similarly, if the digital-circuit portion generates any error that causes the processed first test pattern to contain more than one error in it, this will also cause the output Dout1 of the first testing apparatus 23a to not equalize the first specific value S1. Consequently, multiple errors generated by the digital-circuit portion can also be detected.

2. The Second Test Pattern

The second test pattern ($Q_1$~$Q_{2n}$, n=16) contains 32-bit digital data ($Q_1$~$Q_{32}$), where $P_{2j-1}$=0, $P_{2j}$=1, and $1 \leq j \leq 16$, so the second test pattern has the form of [$Q_1$ $Q_2$ $Q_3$ $Q_4$ . . . $Q_{31}$ $Q_{32}$]=[0 1 0 1 . . . 0 1].

Figure 6:
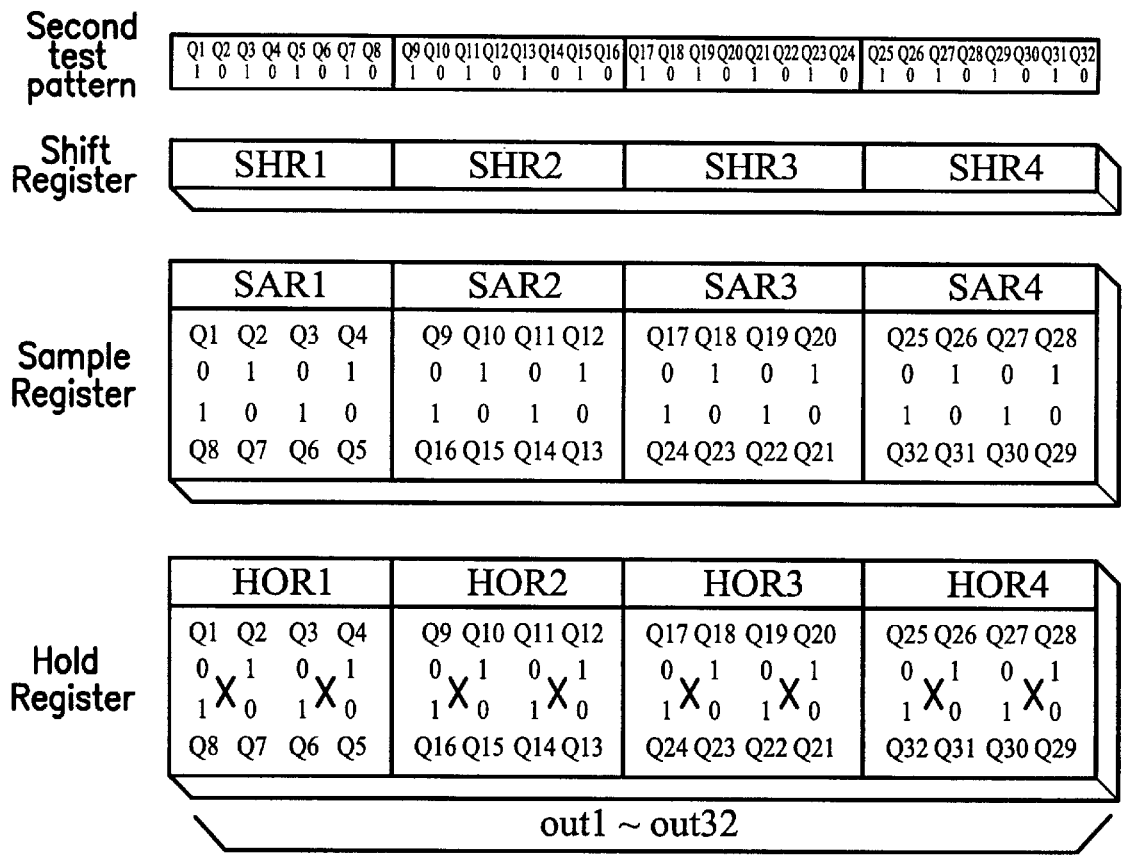
FIG. 6 schematically illustrates the structure of a second testing method of the present invention.
Figure 6:
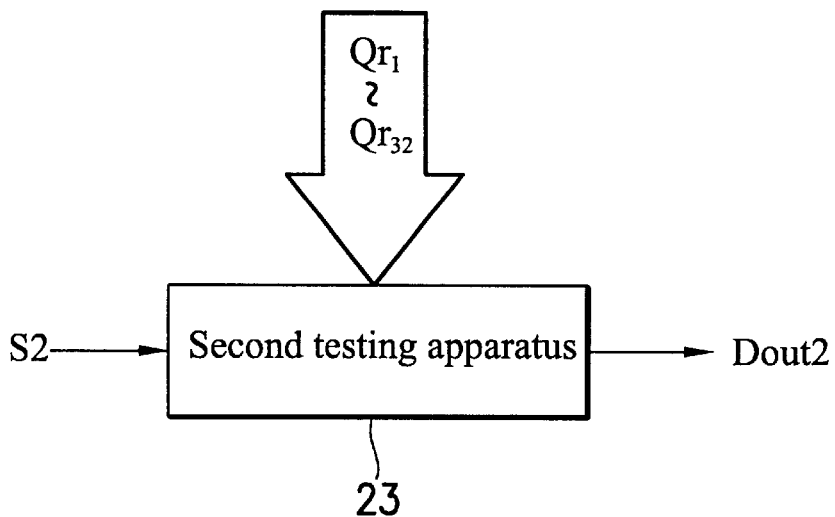

Referring to FIG. 6, the above second test pattern [$Q_1$ $Q_2$ $Q_3$ $Q_4$ . . . $Q_{31}$ $Q_{32}$] is equally divided into four sets of data, [$Q_1$~$Q_8$], [$Q_9$~$Q_{16}$], [$Q_{17}$~$Q_{24}$], and [$Q_{25}$~$Q_{32}$]. Then these four sets of data are to be processed by four shift registers (SHR1~SHR4), four sample registers (SAR1~SAR4), and four hold registers (HOR1~HOR4) separately (i.e. processed by the digital-circuit portion of the data driver), in such a way that the first processed data [$Qr_1$ $Qr_2$ $Qr_3$ $Qr_4$ . . . $Qr_{31}$ $Qr_{32}$] are outputted from the output terminals (out1~out32) of the hold registers (HOR1~HOR4).

Analogous to the first test pattern, the circuit layout and/or test pattern can be arranged in such a way that each of the processed data ($Qr_1$, $Qr_3$, $Qr_5$, . . . $Qr_{29}$, $Qr_3$) outputted via the odd-numbered output terminals of the hold registers (out1, out3, out5, . . . out29, out31) corresponds to one of the different odd-numbered input data $Q_{2j-1}$, where $1 \leq j \leq 16$, of the second test pattern. By the same token, the circuit layout and/or test pattern can be arranged in such a way that each of the processed data ($Qr_2$, $Qr_4$, $Qr_6$, . . . $Qr_{30}$, $Qr_{32}$) outputted via the even-numbered output terminals of the hold registers (out2, out4, out6, . . . out30, out32) corresponds to one of the different even-numbered input data $Q_{2j}$, where $1 \leq j \leq 16$, of the second test pattern.

In the present embodiment, the [$Q_1$ $Q_8$ $Q_7$ $Q_2$ $Q_3$ $Q_6$ $Q_5$ $Q_4$] data, after being processed, serve as the processed data $Qr_1$~$Qr_8$ outputted via the output terminals out1~out8, respectively; the [$Q_9$ $Q_{16}$ $Q_{15}$ $Q_{10}$ $Q_{11}$ $Q_{14}$ $Q_{13}$ $Q_{12}$] data, after being processed, serve as the processed data $Qr_9$~$Qr_{16}$ outputted via the output terminals out9~out16, respectively; the [$Q_{17}$ $Q_{24}$ $Q_{23}$ $Q_{18}$ $Q_{19}$ $Q_{22}$ $Q_{21}$ $Q_{20}$] data, after being processed, serve as the processed data $Qr_{17}$~$Qr_{24}$ outputted via the output terminals out17~out24, respectively; and the [$Q_{25}$ $Q_{32}$ $Q_{31}$ $Q_{26}$ $Q_{27}$ $Q_{30}$ $Q_{29}$ $Q_{28}$] data, after being processed, serve as the processed data $Qr_{25}$~$Qr_{32}$ outputted via the output terminals out25~out32.

Accordingly, the second testing apparatus 23b receives inputs of both the second processed data [$Qr_1$ $Qr_2$ $Qr_3$ $Qr_4$ . . . $Qr_{31}$ $Qr_{32}$] and the second specific value S2, and it then outputs processed data Dout2.

Figure 7:
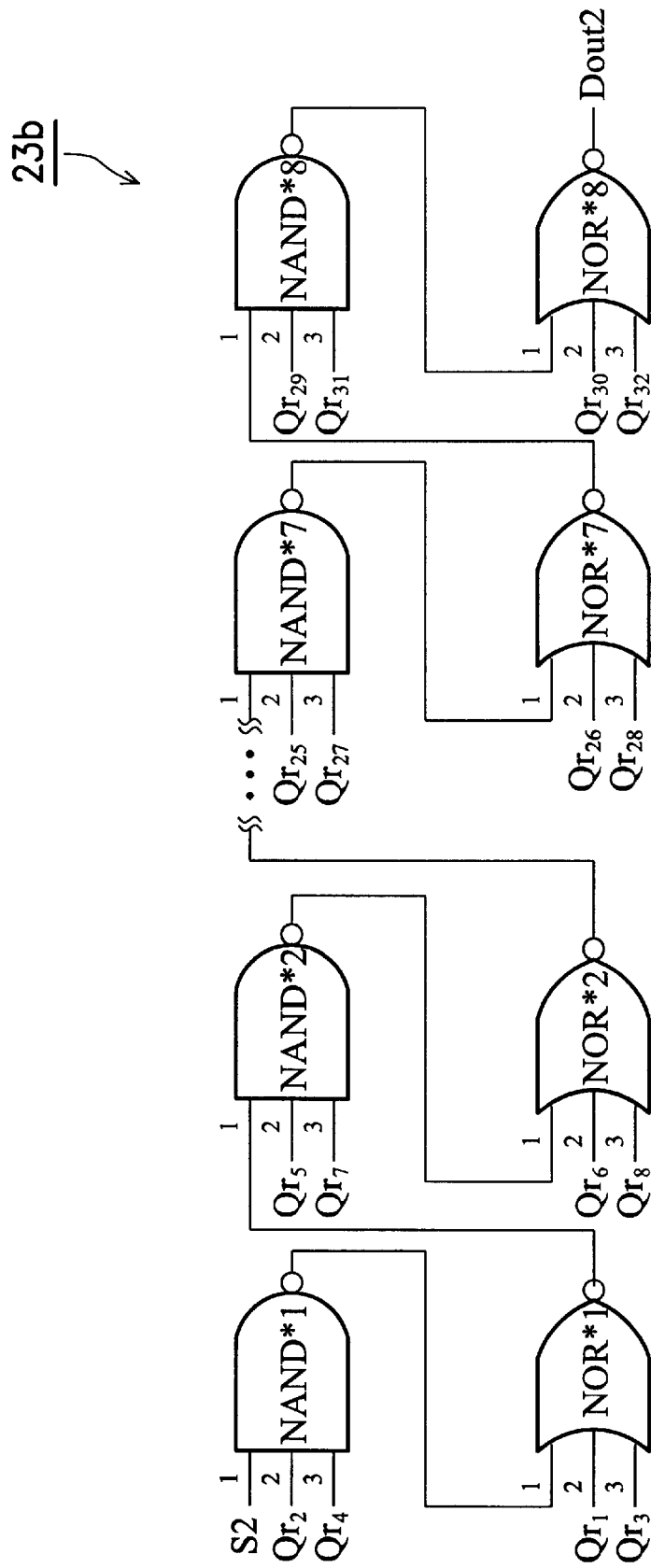
FIG. 7 schematically illustrates the structure of the second test apparatus 23b.

Referring to FIG. 7, in this embodiment the second testing apparatus 23b comprises eight NOR gates and eight NAND gates alternately interconnecting with each other in series. The eight NAND gates (NAND*1~NAND*8) serve as the second-type tester (U2#1~U2#8, m=8); every NAND gate has three input terminals and one output terminal. Further, the eight NOR gates (NOR*1~NOR*8) serve as the first-type tester (U1#1~U1#8); every NOR gate has three input terminals and one output terminal.

The second and third input terminals of each of the NAND gates (NAND*1~NAND*8) receive the first processed data ($Qr_1$, $Qr_3$), ($Qr_5$, $Qr_7$), . . . ($Qr_{29}$ $Qr_{31}$) respectively; the second and third input terminals of each of the NOR gates (NOR*1~NOR*8) receives the first processed data ($Qr_2$, $Qr_4$), ($Qr_6$, $Qr_8$), . . . ($Qr_{30}$ $Qr_{32}$) respectively.

Analogous to the first test pattern, if the second test pattern [$Q_1$ $Q_2$ $Q_3$ $Q_4$ . . . $Q_{31}$ $Q_{32}$], which has been processed by the digital-circuit portion DT (i.e. shift register, sample register, and hold register), does not produce any error during the process, then none of the data of [$Q_1$ $Q_2$ $Q_3$ $Q_4$ . . . $Q_{31}$ $Q_{32}$] will be changed throughout the process.

From above descriptions, the data [$Q_1$ $Q_8$ $Q_7$ $Q_2$ $Q_3$ $Q_6$ $Q_5$ $Q_4$] after being processed are outputted via out1~out8 output terminals and serve as the second processed data $Qr_1$~$Qr_8$; the data [$Q_9$ $Q_{16}$ $Q_{15}$ $Q_{10}$ $Q_{11}$ $Q_{14}$ $Q_{13}$ $Q_{12}$] after being processed are outputted via out9~out16 output terminals and serve as the second processed data $Qr_9$~$Qr_{16}$; the data [$Q_{17}$ $Q_{24}$ $Q_{23}$ $Q_{18}$ $Q_{19}$ $Q_{22}$ $Q_{21}$ $Q_{20}$] after being processed are outputted via out17~out24 output terminals and serve as the second processed data $Qr_{17}$~$Qr_{24}$; and the data [$Q_{25}$ $Q_{32}$ $Q_{31}$ $Q_{26}$ $Q_{27}$ $Q_{30}$ $Q_{29}$ $Q_{28}$] after being processed are outputted via out25~out32 output terminals and serve as the second processed data $Pr_{25}$~$Pr_{32}$. Therefore, if the digital-circuit portion DT processes the second data pattern without any error, then the value of the second processed data [$Qr_1$ $Qr_2$ $Qr_3 Qr_4 \ldots Qr_{31} Qr_{32}$] outputted by terminals out1~out32 of the hold registers (HOR1~HOR4) should be [1 0 1 0 ... 1 0], where $Qr_{2j-1}=1$ and $Qr_{2j}=0$ ($1 \leq j \leq 16$).

Consequently, the first NAND gate (NAND*1) would receive the second specific value S2 (the value S2 is "1" in this embodiment) and the second processed data [$Qr_1, Qr_3$] then output the value "0"; the first NOR gate (NOR*1) would receive the value "0" outputted by NAND*1 and the data [$Qr_2, Qr_4$] then output the value "1". In a like manner, when the eighth NAND gate (NAND*8) receives the value "1" outputted by NOR*7 and the processed data [$Qr_{29}, Qr_{31}$], it will then output a value "0", and when the eighth NOR gate (NOR*8) receives the value "0" outputted by NAND*8 and the data [$Qr_{30}, Qr_{32}$], it will then output a value "1". As a result, if no error is produced or generated by the processing of the digital-circuit portion DT, then the output data value Dout2 of the second testing apparatus 23b should be "1".

On the other hand, if, during the operating process of the digital-circuit portion DT, an error is generated in that at least one data value of the first test pattern [$Q_1 Q_2 Q_3 Q_4 \ldots Q_{31} Q_{32}$] has been changed, for example, a certain $Q_{2j-1}$ changes its value from "1" to "0" or a certain $Q_{2j}$ changes its value from "0" to "1", then the output Dout2 of the second testing apparatus 23b would not have been "1" but "0". Thus, the error caused by the digital-circuit portion DT can be detected.

Another example of an error caused by the digital-circuit portion would be that when $Q_{26}$ changes its value from "0" to "1" ; since $Qr_{25}$~$Qr_{32}$ are the processed data of [$Q_{25} Q_{32} Q_{31} Q_{26} Q_{27} Q_{30} Q_{29} Q_{28}$] outputted via terminals out25~out32, $Qr_{28}$ also changes its value from "0" to "1", corresponding to $Q_{26}$. Because there is no error generated at $Qr_1$~$Qr_{27}$, the output value of NAND*1~NAND*7 will all be "0" and the output value of NOR*1~NOR*6 will all be "1" after the second testing apparatus 23b receives the second specific value S2="1". Then, the gate NOR*7 receives both the output value "0" from the gate NAND*7 and the second processed data $Qr_{26}$ and $Qr_{28}$ ("0" and "1", respectively), so the output of NOR*7 becomes "0" which, in turn, makes the output of NAND*8 "1". The final output of the gate NOR*8 then becomes "0" as a consequence. Since the output Dout2, of the second testing apparatus 23b, of value "0" does not equal the second specific value S2 of value "1", thus the error generated by the digital-circuit portion can be detected.

Similarly, if the digital-circuit portion generates any error that causes the processed second test pattern to contain more than one error in it, this will also cause the output Dout2 of the second testing apparatus 23b to not equalize the second specific value S2. Consequently, multiple errors generated by the digital-circuit portion can also be detected.

From the aforementioned examples, when the digital-circuit portion of an IC is being tested, it can be seen that the circuit layout and test pattern are arranged in such a way that the data values stored in every shift register and every hold register at any adjacent location (left/right or up/down) are to be logic "0" and logic "1", respectively. Accordingly, from any shift register to any corresponding hold register and from any hold register to any corresponding DAC, every two adjacent signal lines of the 8-bit connecting lines also transmit the data of logic "0" and logic "1" respectively. Therefore, if the transmitted data on any signal line is stuck at "0" or stuck at "1" due to error operation or circuit defect, it will be detected according the present invention.

On the other hand, if a short circuit occurs between any of the two adjacent signal lines, then these two lines must both be either logic "0" or logic "1". For instance, if the two adjacent signal lines that transmit the data $Pr_1$ and $Pr_2$ (0, 1) in FIG. 5 are incidentally short-circuited, from FIG. 5 it can be seen that the value of $Pr_1$ to be inputted to NOR1 will be changed from "0" to "1" (or that the value of $Pr_2$ to be inputted to NAND1 will be changed from "1" to "0"). When the output Dout1 (or the output Dout2) of the first testing apparatus 23a (or the second testing apparatus 23b) does not equal S1 (or S2), NOR1 (or NAND1) will detect and identify this status as an error.

Furthermore, if any input terminal of each of the NOR gates or NAND gates in FIG. 5 is short-circuited, the short circuit error will be detected as well. For instance, the NOR1 gate receives data from both $Pr_1$ and $Pr_3$. The signal line transmitting the data $Pr_2$, which is supposed to have opposite logic value to $Pr_1$ and $Pr_3$, is arranged between the signal lines transmitting the data $Pr_1$ and $Pr_3$. From a planar point of view, if the signal lines transmitting $Pr_1$ and $Pr_3$ are incidentally shorted together, the signal lines that transmit $Pr_1$ $Pr_2$, and $Pr_3$ are certainly shorted together. Consequently, if the electrical potentials of $Pr_1$ and $Pr_2$ are correct, then the error due signal line shorted to $Pr_3$ will be detected and identified.

In this embodiment, the input image data are 32-bit as an example. The image data are separately processed by four shift registers (SHR1~SHR4), four sample registers (SAR1~SAR4), and four hold registers (HOR1~HOR4). Then, the hold registers (HOR1~HOR4) output these processed 32-bit data to a digital-to-analog converter DAC1 via the output terminals out1~out32; the DAC1 comprises four 8-bit DAC.

Figure 8:
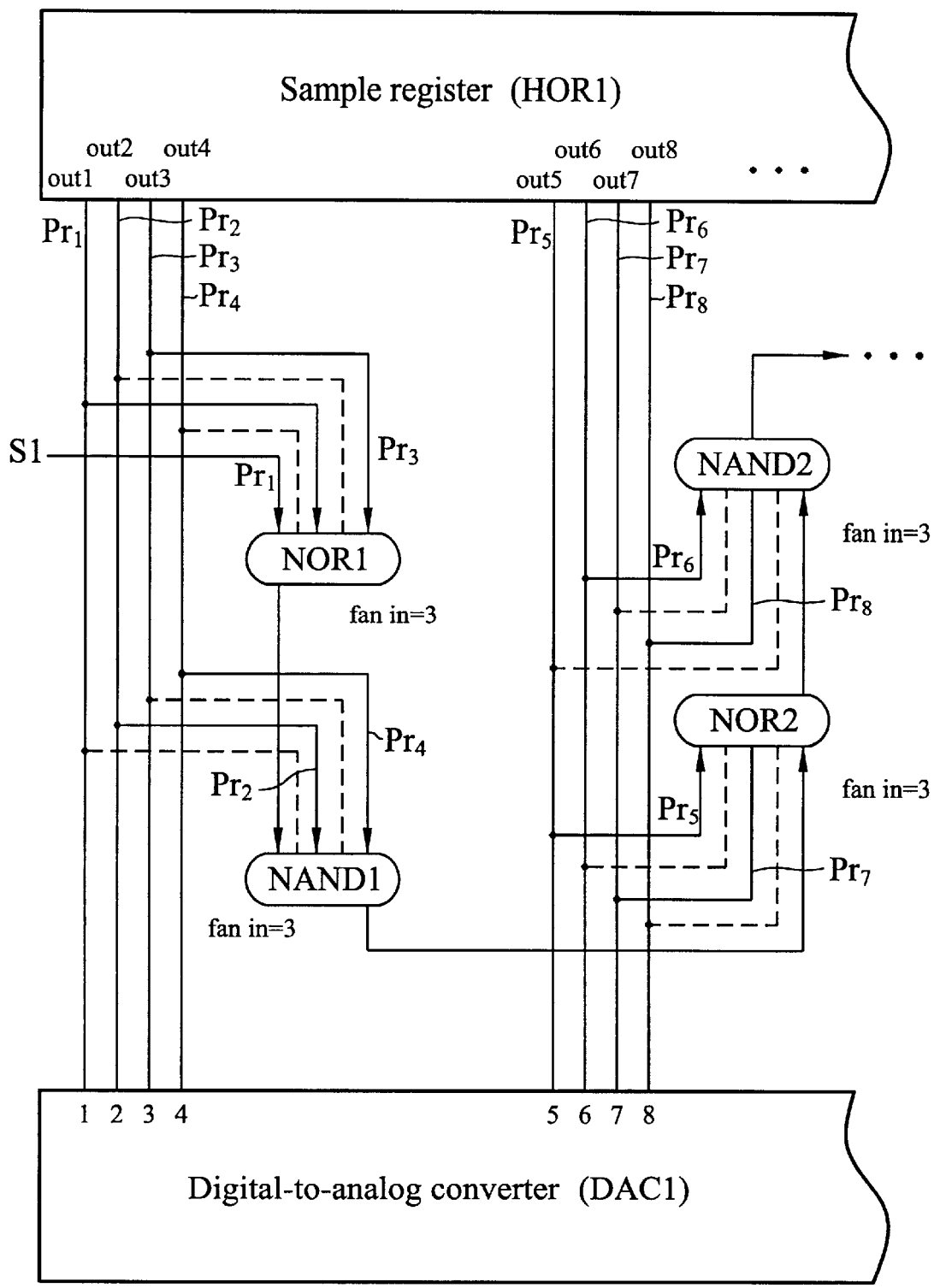
FIG. 8 depicts routing arrangement of the test apparatus within the structure of the data driver in consideration of the first test pattern.

Referring to FIG. 8, in order to grasp the idea of test circuit routing applied to the method for testing the digital-circuit portion of a data driver, consider the condition under which the first test pattern is inputted. First of all, the data $P_1$~$P_8$ of the first test pattern are processed through the shift register (SHR1), the sample register (SAR1) and the hold register (HOR1) depicted in FIG. 4, then outputted from the output terminals of the hold register (HOR1), and assigned as the first processed data $Pr_1$~$Pr_8$ respectively.

In order to demonstrate the concept of test circuit routing in brevity, the demonstration as follows will be limited to routing of digital data $Pr_1$~$Pr_8$ between the output terminals out1~out8 of hold register (HOR1) and the input terminals of an 8-bit DAC. The data output and routing between the other output terminals out9~out32 and the other three 8-bit DAC will be temporarily ignored since the concept can be derived directly.

As shown in FIG. 8, the output terminals out1~out8 of the hold register (HOR1) is coupled directly to the 8-bit digital-to-analog converter DAC1 for the normal operation of image data processing by the data driver. After the first test pattern is inputted, the data [$P_1 P_8 P_7 P_2 P_3 P_6 P_5 P_4$] are processed and outputted as the processed data $Pr_1$~$Pr_8$ via out1~out8. The NOR1 gate of the first testing apparatus 23a is coupled to $Pr_1, Pr_3$, and S1; the NAND1 gate of the first testing apparatus 23a is coupled to $Pr_2, Pr_4$, and the output of NOR1; the NOR2 gate of the first testing apparatus 23a is coupled to $Pr_5, Pr_7$, and the output of NAND1; the NAND2 gate of the first testing apparatus 23a is coupled to $Pr_6, Pr_8$, and the output of NOR2.

In addition, the testing circuit routing of the present invention comprises certain dummy signal lines shown as dotted lines in FIG. 8.

Further, the dummy signal line branched from the signal line transmitting the data $Pr_2$ (or $Pr_4$) is arranged between and in parallel to the signal lines transmitting the data $Pr_1$ and $Pr_3$ (or the data S1 and $Pr_1$), and it extends toward the NOR gate NOR1. The dummy signal line branched from the signal line transmitting the data $Pr_6$ (or $Pr_8$) is arranged between and in parallel to the signal lines transmitting the data $Pr_5$ and $Pr_7$ (or the data Pr7 and the output of the NAND gate NANDL), and it extends toward the NOR gate NOR2. The dummy signal line branched from the signal line transmitting the data $Pr_3$ (or $Pr_1$) is arranged between and in parallel to the signal lines transmitting the data $Pr_2$ and $Pr_4$ (or the data $Pr_2$ and the output of the NOR gate NOR1), and it extends toward the NAND gate NAND1. And finally, the dummy signal line branched from the signal line transmitting the data $Pr_7$ (or $Pr_5$) between and in parallel to $Pr_6$ and $Pr_8$ (or the data $Pr_8$ and the output of the NOR gate NOR2), and it extends toward NAND2. With the help of all these dummy signal lines, detection of every possible short circuit can be achieved.

The arrangement of the dummy signal lines will not require additional layout area since the width of each of the dummy signal lines only occupies 0.6 µm, with 0.6 µm line pitch. The area occupied by NOR/NAND provides the additional layout area.

The aforementioned routing layout in FIG. 8 is used for illustrating the testing scheme based on the first test pattern. Similarly, the routing layout for illustrating the testing scheme based on the second test pattern, in reference with FIG. 7, requires only the switching of NOR and NAND gate locations and changing of the data outputted via terminals out1~out32, to the second processed signals $Qr_1$~$Qr_{32}$.

In the first (or second) testing apparatus 23a (or 23b) of the aforementioned embodiment, each of the NOR gate and NAND gate has three input terminals and one output terminal. Alternatively, the present invention can be adapted to utilize the NOR gate and NAND gate with a number of k input terminals, such as four input terminals, depending on the requirements of the overall design of the test pattern.

Based on the above analysis, it should be stressed that the testing method of the present invention has the capability to detect LCD defects, including short circuit, "stuck at 1", and "stuck at 0", which are caused mainly by photo-mask shifting, poor manufacturing quality, and airborne dust particles. Therefore, the fault coverage rate by this testing method is very high, and the method only requires two types of test pattern. Further, the cycle time for each circuit test is equal to the time needed to sample the horizontal synchronization signal of the silicon on wafer LCD twice. In other words, the testing method of the present invention is simultaneously quick and accurate.

EMBODIMENT II: Method for Pixel Area Testing

The purpose of pixel area testing is to detect and identify the existence of any pixel defect in the pixel area and to calculate the total number of pixel defects and their location distribution thereto. As show in FIG. 9, the conventional pixel area testing method takes to input both the highest and lowest pixel voltages of the pixel units in parallel to the pixel units, and then the voltages written to the pixel units are read out in serial and compared with the original input voltages.

In general, the conventional method takes a long time for testing pixel area. For instance, the pixel area structure depicted in FIG. 9 comprises M scan-lines (SCAN_1 ~SCAN_M), and N data input terminals along every scan-line. Therefore, it takes M×N clock cycles to carry out the entire testing for the M×N pixel units completely. The pattern for testing always has a long data format. Therefore, besides the problems of being time-consuming and not very cost effective, the exceedingly long test pattern might even surpass the capacity of the testing apparatus buffer for it to function properly, or it might cause the testing apparatus not to function at all. Eventually, as the resolution of the display panels increase, it will be a major task to find a pixel area testing method with a short test pattern in order to lower the production time, cost and testing cost while maintaining the quality of the products.

Figure 10:
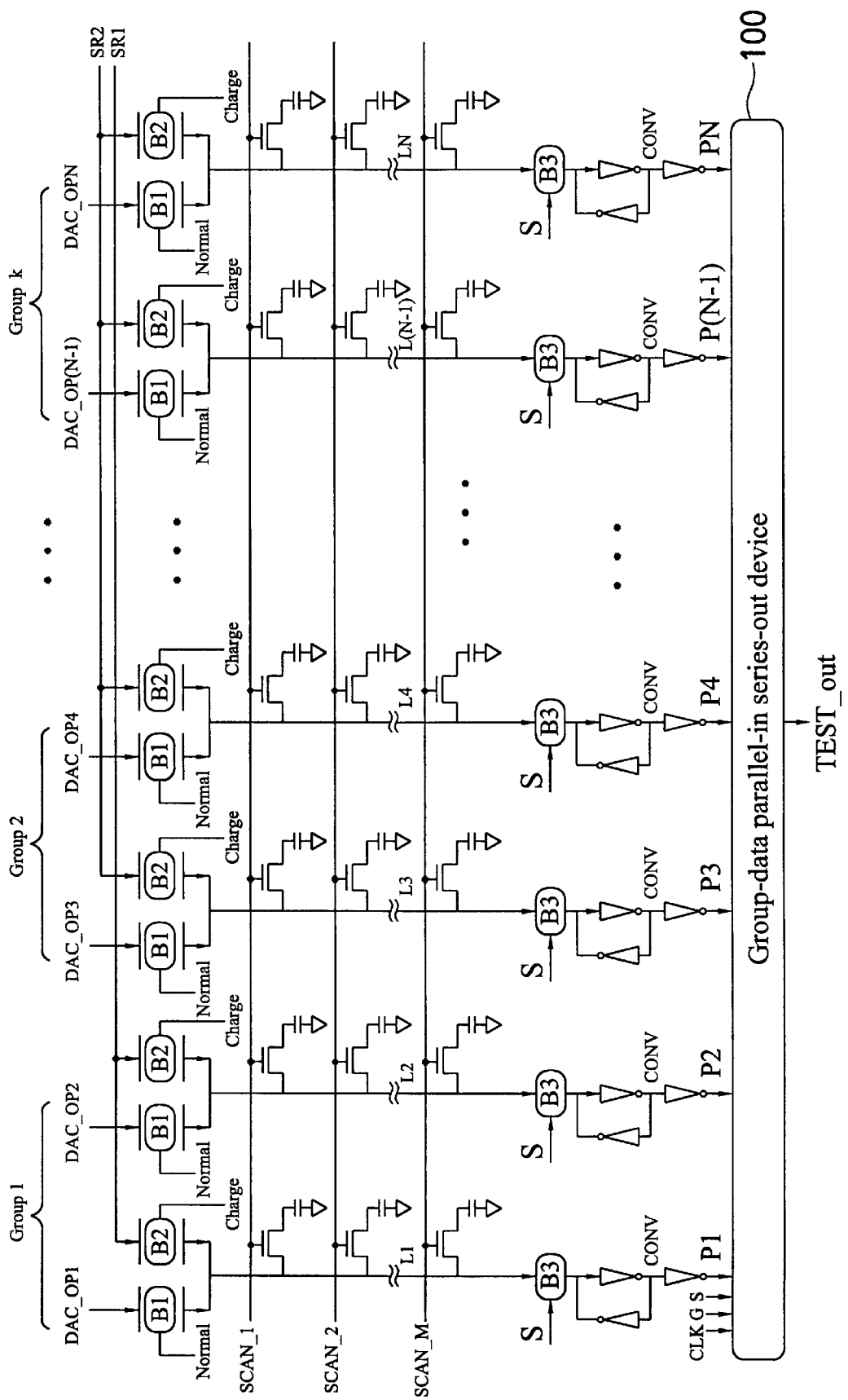
FIG. 10 schematically illustrates the structure for testing the display panel pixel area according to the present invention.

Referring to FIG. 10, a testing structure used for working in conjunction with the pixel area testing method of the present invention is shown; the testing method is realized by additionally providing a group-data parallel-in series-out device 100. Under the normal operation of panel display, a normal signal is enabled (Normal=1) such that image data DAC_OP1, DAC_OP2~DAC_OPN outputted from the digital-to-analog converter (DAC) can be written in sequence to the pixel units through the every corresponding buffer B1 and the each of the data lines (L1~LN).

Otherwise, if the Normal signal is set to be "0", then the pixel area of the display panel is under test. While under test, the signal Charge is set to the logical value "1" (that is Charge=1), thereby activating all of the B2 buffers. The activated B2 buffers, in turn, enable electrical connections between the L1~LN data lines and corresponding signal lines SR1 and SR2 such that the testing data can be written into each of the pixel units at all the scan-lines. According to the status of the parallel/series control signal S, the aforementioned group-data parallel-in series-out device 100 will receive the pixel data P1~PN read via the data lines L1~LN in parallel when S=1; when S=0, the group-data parallel-in series-out device 100 outputs the received pixel data P1~PN in series after they are processed by device 100.

In order to carry out the testing method of the present invention, the N data lines (L1~LN) are divided into K pixel groups such as group 1~group K. Each of the pixel groups comprises i data lines, where i≧2 and K=N/i. In this embodiment, every pixel group is defined as comprising two adjacent data lines. Accordingly, the data lines L1 and L2 via which DAC_OP1 and DAC_OP2 are written into the pixel units, are defined as the first pixel group; the data lines L3 and L4 via which DAC_OP3 and DAC_OP4 are written into the pixel units, are defined as the second pixel group. Analogously, it is evident that the data lines L(N−1) and LN via which DAC_OP(N−1) and DAC_OPN are written into the pixel units, are defined as the $K^{th}$ pixel group.

Figure 11:
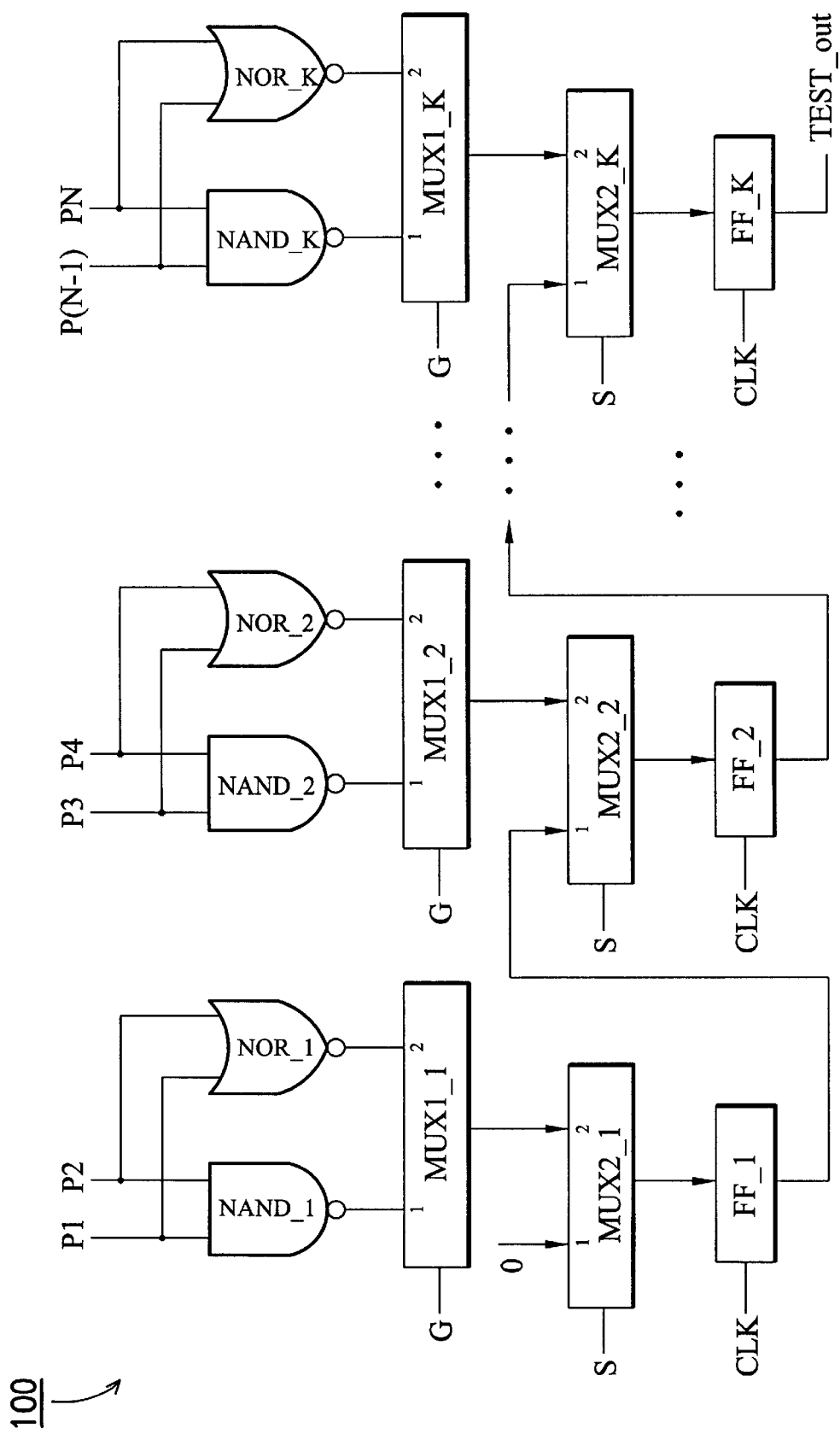
FIG. 11 illustrates the circuit arrangement for the group-data parallel-in series-out apparatus.

Furthermore, the electrical circuit structure diagram of the group-data parallel-in series-out device 100 in FIG. 10 is shown in FIG. 11. The group-data parallel-in series-out device 100 comprises: K NAND gates (NAND_1~NAND_K) and K NOR gates (NOR_1 ~NOR_K), wherein each of the NAND gates and NOR gates have two input terminals; K first multiplexing devices (MUX1_1~MUX1_K) and K second multiplexing devices (MUX2_1~MUX2_K); and K flip-flops (FF_1~FF_K).

Both of the NAND_1 and NOR_1 gates are coupled to the P1 and P2 data inputs, and their outputs are both coupled to the input terminals of the MUX1_1; both of the NAND_2 and NOR_2 gates are coupled to the P3 and P4 data inputs, and their outputs are both coupled to the input terminals of the MUX1_2. Analogously, it can be derived that both of the NAND_K and NOR_K gates are coupled to the P(N−1) and PN data inputs, and their outputs are both coupled to the input terminals of the MUX1_K.

According to the status of the signal G, each of the first multiplexing devices (MUX1_1~MUX1K) selectively outputs the output of the NAND gate or the NOR gate to the second input terminal of the corresponding second multiplexing device (one of the MUX2_1, ~MUX2_K). When G=0, each of the first multiplexing devices chooses to output data from the NAND gate; when G=1, the first multiplexing device chooses to output data from the NOR gate.

The outputs of each of the second multiplexing devices (MUX2_1~MUX2_K) is coupled to one of the flip-flops (FF_1~FF_K) respectively. Further, the output of the flip-flop FF_1 is coupled to the first input terminal of MUX2_2; the output of the flip-flop FF_2 is coupled to the first input terminal of MUX2_3. Analogously, it is evident that the output of FF_(K−1) is coupled to the first input terminal of MUX2_K. When the parallel/series control signal S equals 1, each of the second multiplexing devices (MUX2_1~MUX2_K) would output the data appearing at the second input terminal thereof, in parallel, to each of the corresponding flip-flop devices (FF_1~FF_K). When the parallel/series control signal S equals 0, then the data inputted to each of the flip-flop devices (FF_1~FF_K), after K clock cycles, would all eventually be outputted via the output terminal (TEST_out) of the flip-flop FF_K in series.

Referring to FIG. 10 and 11, the testing steps of the method according to the present invention will be described in detail hereinafter. Note, the Normal signal is set to "0", so testing of the pixel area of the display panel can proceeds.

Step 1

Make signal G equal 0, so that the first multiplexing devices (MUX1_1~MUX1_K) are set to output the data of the NAND gates to the second input terminals of the second multiplexing devices (MUX2_1~MUX2_K).

Selectively activate the first scan-line (SCAN_1).

Make the signal Charge equal 1 to enable all buffers (B2), and then write a low voltage signal (such as 0V), via signal line SR1, into the capacitors in the pixel units of the odd-numbered pixel groups (group 1, 3, 5, . . . ). Moreover, write a high voltage signal (such as 10V), via signal line SR2, into the capacitors in the pixel units of the even-numbered pixel groups (group 2, 4, 6, . . . ).

Disable the First Scan-line SCAN_1

Write the mean voltage signal (such as 5V), via signal lines SR1 and SR2, into each parasitic capacitor in each of the data lines L1~LN.

Make the signal Charge equal 0, cut off the electrical connection between the data lines (L1~LN) and the signal lines (SR1, SR2), so that each of the data lines (L1~LN) becomes floating, and the floating voltage is about 5V.

Make parallel/series control signal S equal 1 to enable all buffers (B3), so that the group-data parallel-in series-out device 100 is standby to accept the parallel input of data (P1~PN).

Further, selectively activate the first scan-line SCAN_1. At this time, the charges stored in the parasitic capacitors of the data lines (L1~LN) and the charges stored in the pixel units at the scan-line (SCAN_1) are re-distributed. Assuming the capacitance of each of the parasitic capacitors equals that of each of the capacitors in the pixel units. Then after the re-distribution, the output data from each of the data lines L1–L2, L5–L6, L9–L10, . . . has a low voltage signal of about 2.5V; the output data from each of the data lines L3–L4, L7–L8, L11–L12, . . . has a high voltage signal of about 7.5V. Thus, the data of the first test pattern of length K are written into K pixel groups (from group 1 to group K).

The signals at the data lines (or pixel groups) are converted to logic signals P1~PN, via the buffers B3 and converters CONV. The logical signals P1~PN are inputted, in parallel, to the group-data parallel-in series-out device 100, and processed through the NAND gates, the NOR gates, the first multiplexing devices, and the second multiplexing devices as described in FIG. 11. Therefore, K processed data are generated and stored in the flip-flops (FF_1~FF_K).

Make the parallel/series control signal S equal 0, the processed data in each of the flip-flops (FF_1~FF_K), after K clock cycles, will eventually be outputted in series via the output terminal (TEST_out) of the flip-flop FF_K as the first processed data.

Step 2

Make signal G equal 1, so that the first multiplexing devices (MUX1_1~MUX1_K) are set to output the data of the NOR gates to the second input terminals of the second multiplexing devices (MUX2_1~MUX2_K).

Selectively activate the first scan-line (SCAN_1).

Make the signal Charge equal 1 to enable all buffers (B2), and then write a high voltage signal (such as 10V), via signal line SR1, into the capacitors in the pixel units of the odd-numbered pixel groups (group 1, 3, 5, . . . ). Moreover, write a low voltage signal (such as 0V), via signal line SR2, into the capacitors in the pixel units of the even-numbered pixel groups (group 2, 4, 6, . . . ).

Disable the First Scan-line SCAN_1

Write the mean voltage signal (such as 5V), via signal lines SR1 and SR2, into each parasitic capacitor in each of the data lines L1~LN.

Make the signal Charge equal 0, cut off the electrical connection between the data lines (L1~LN) and the signal lines (SR1, SR2), so that each of the data lines (L1~LN) becomes floating, and the floating voltage is about 5V.

Make parallel/series control signal S equal 1 to enable all buffers (B3), so that the group-data parallel-in series-out device 100 is standby to accept the parallel input of data (P1~PN).

Further, selectively activate the first scan-line SCAN_1. At this time, the charges stored in the parasitic capacitors of the data lines (L1~LN) and the charges stored in the pixel units at the scan-line (SCAN_1) are re-distributed. Assuming the capacitance of each of the parasitic capacitors equals that of each of the capacitors in the pixel units, then, after the re-distribution, the output data from each of the data lines L1–L2, L5–L6, L9–L10, . . . has a high voltage signal of about 7.5V; the output data from each of the data lines L3–L4, L7–L8, L11–L12, . . . has a low voltage signal of about 2.5V. Thus, the data of the second test pattern of length K are written into K pixel groups (from group 1 to group K).

The signals at the data lines (or pixel groups) are converted to logic signals P1~PN, via the buffers B3 and converters CONV. The logical signals P1~PN are inputted, in parallel, to the group-data parallel-in series-out device 100, and processed through the NAND gates, the NOR gates, the first multiplexing devices, and the second multiplexing devices as described in FIG. 11. Therefore, K processed data are generated and stored in the flip-flops (FF_1~FF_K).

Make the parallel/series control signal S equal 0, the processed data in each of the flip-flops (FF_1~FF_K), after K clock cycles, will eventually be outputted in series via the output terminal (TEST_out) of the flip-flop FF_K as the second processed data.

Step 3

Repeat STEP 1 and STEP 2 until all M scan-lines are tested. Accordingly, every time a scan-line is tested, the aforementioned first test pattern is compared with the first processed data, and the aforementioned second test pattern is compared with the second processed data, so that any pixel defect can be detected and identified.

Figure 9:
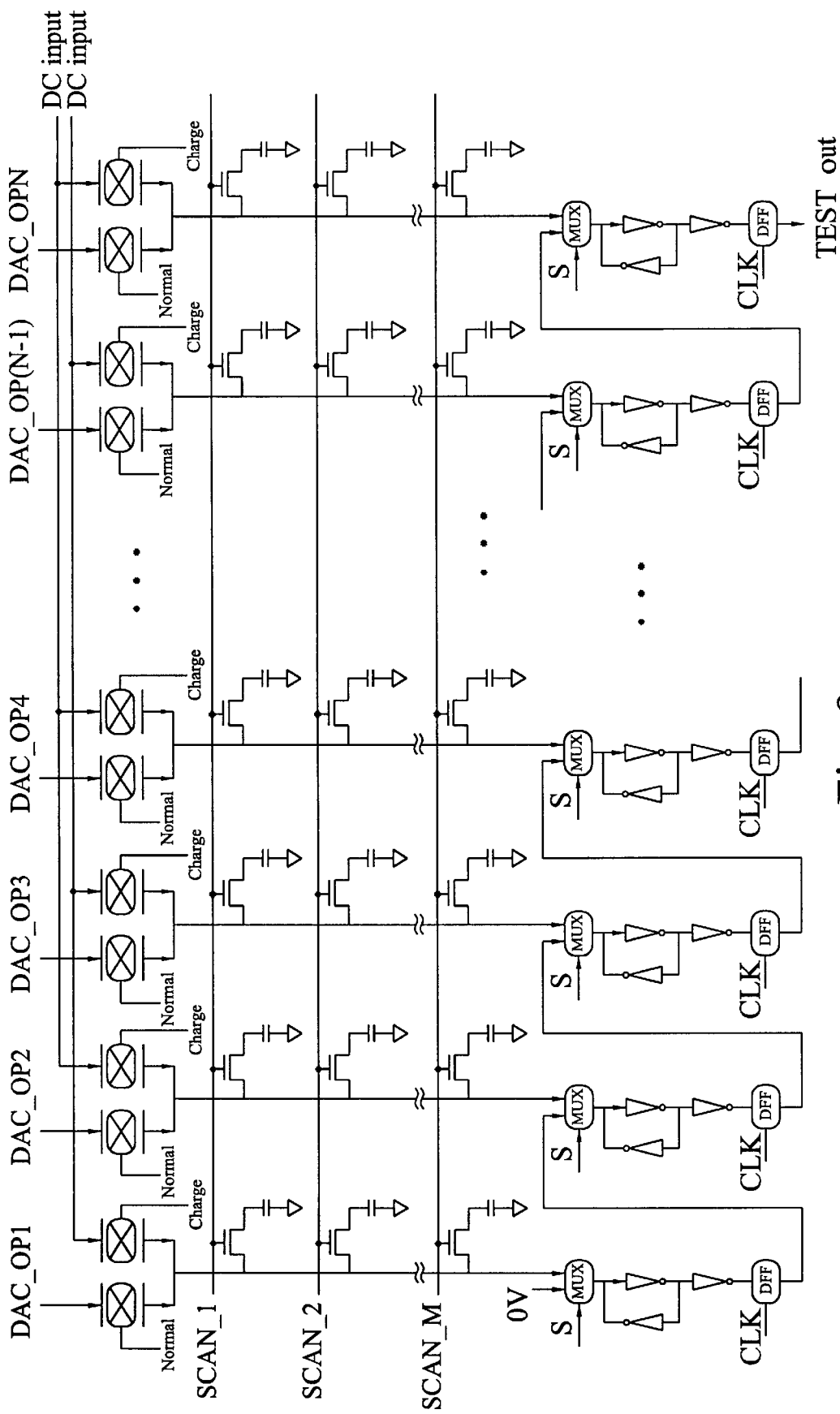
FIG. 9 schematically illustrates the conventional structure for testing the pixel area of a display panel.

The conventional test cycle, according to the pixel area testing method depicted in FIG. 9, requires a total of n flip-flops, so it takes about M×N clock cycles to complete a single test. However, the pixel area testing method according to the present invention, described in reference with FIG. 10 and 11, requires only n/i flip-flops, n/i NAND gates, n/i NOR gates, and n/i multiplexing devices, so it takes about M×(N/i) clock cycles to complete a single test.

Therefore, the present invention reduces the time for each test cycle while keeping the cost of circuit test down.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of testing a reflection-type LCD projector, focusing on testing the digital-circuit portion of the data drivers of the silicon wafer liquid crystal of the projector, comprising the steps of:

providing a first test pattern which has 2n bits of digital data $(P_1 \sim P_{2n})$; where $P_{2j-1}=0$, $P_{2j}=1$, and $1 \leq j \leq n$;

providing a second test pattern which has 2n bits of digital data $(Q_1 \sim Q_{2n})$; where $Q_{2j-1}=1$, $Q_{2j}=0$;

inputting the first test pattern $(P_1 \sim P_{2n})$ to the digital-circuit portion, obtaining 2n bits of the first processed data $Pr_1 \sim Pr_{2n}$ from the digital-circuit portion; wherein every value of $P_1$, $P_3$, $\sim P_{2n-1}$ processed by the digital-circuit portion is assigned to each of the respective $Pr_{2j-1}$, while every value of $P_2$, $P_4$, $\sim P_{2n}$ processed by the digital-circuit portion is assigned to each of the respective $Pr_{2j}$;

inputting the second test pattern $(Q_1 \sim Q_{2n})$ to the digital-circuit portion, obtaining 2n bits of the second processed data $Qr_1 \sim Qr_{2n}$ from the digital-circuit portion; wherein every value of $Q_1$, $Q_3$, $\sim Q_{2n-1}$ processed by the digital-circuit portion is assigned to each of the respective $Qr_{2j-1}$, while every value of $Q_2$, $Q_4$, $\sim Q_{2n}$ processed by the digital-circuit portion is assigned to each of the respective $Qr_{2j}$;

providing a first testing apparatus for receiving a first specific value and the first processed data $Pr_1 \sim Pr_{2n}$; and providing a second testing apparatus for receiving a second specific value and the second processed data $Qr_1 \sim Qr_{2n}$;

wherein if the first and second testing apparatuses output the first and second specific values respectively, then the digital-circuit portion has processed the first and second test patterns without any error.

2. The method as claimed in claim 1, wherein m first-type testers (T1#1~T1#m) and m second-type testers (T2#1~T2#m) are provided and connected alternately and serially to compose the first testing apparatus; each of the first-type and second-type testers has k input terminals, where mx (k−1)=n; the first input terminal of the first-type tester (T1#1) is coupled to the first specific value, and the output of the first-type tester (T1#1) is coupled to the first input terminal of the second-type tester (T2#1); the first input terminal of the first-type tester (T1#y) is coupled to the output of the second-type tester (T2#(y−1)), and the output of the first-type tester (T1#y) is coupled to the first input terminal of the second-type tester (T2#y), where $2 \leq y \leq m$; the k−1 other input terminals of each of the first-type testers are selectively coupled to k−1 different $Pr_{2j-1}$ data from the first processed data $(Pr_1 \sim Pr_{2n})$, and the k−1 other input terminals of each of the second-type tester are selectively coupled to k−1 different $Pr_{2j}$ data from the respective first processed data $(Pr_1 \sim Pr_{2n})$.

3. The method as claimed in claim 2, wherein the first-type tester is a NOR logic device, the second-type tester is a NAND logic device, and the first specific value is a logic value of "0".

4. The method as claimed in claim 2, wherein the signal lines outputting the first processed data $Pr_1 \sim Pr_{2n}$ are arranged sequentially;

every k−1 signal lines coupled to the data $Pr_{2a-1}$, $Pr_{2a+1}$, $Pr_{2a+3}$, $\sim Pr_{2a+2k-5}$ are extended and connected to the k−1 input terminals of the first-type tester (T1#a), where $1 \leq a \leq m$; every k−2 signal lines coupled to the data $Pr_{2a}$, $Pr_{2a+2}$, $Pr_{2a+4} \sim Pr_{2a+2k-6}$ are arranged sequentially between the corresponding signal lines coupled to the data $Pr_{2a-1}$, $Pr_{2a+1}$, $Pr_{2a+3} \sim Pr_{2a+2k-5}$, and extended toward the first-type tester (T1#a);

every k−1 signal lines coupled to the data $Pr_{2a}$, $Pr_{2a+2}$, $Pr_{2a+4}$, $\sim Pr_{2a+2k-4}$ are extended and connected to the k−1 input terminals of the second-type tester (T2#a); every k−2 signal lines coupled to the data $Pr_{2a+1}$, $Pr_{2a+3}$, $Pr_{2a+5} \sim Pr_{2a+2k-5}$ are arranged sequentially between the corresponding signal lines coupled to the data $Pr_{2a}$, $Pr_{2a+2}$, $Pr_{2a+4} \sim Pr_{2a+2k-4}$ and extended toward the second-type tester (T2#a).

5. The method as claimed in claim 1, wherein m first-type testers (U1#1~U1#m) and m second-type testers (U2#1~U2#m) are provided and connected alternately and serially to compose the second testing apparatus; each of the first-type and second-type testers has k input terminals, where mx (k−1)=n; the first input terminal of the second-type tester (U2#1) is coupled to the second specific value, and the output of the second-type tester (U2#1) is coupled to the first input terminal of the first-type tester (U1#1); the first input terminal of the second-type tester (U2#y) is coupled to the output of the first-type tester (U1#(y−1)), and the output of the second-type tester (U2#y) is coupled to the first input terminal of the first-type tester (U1#y), where $2 \leq y \leq m$; the k−1 other input terminals of each of the second-type testers are selectively coupled to k−1 different $Qr_{2j-1}$ data from the second processed data $(Qr_1 \sim Qr_{2n})$, and the k−1 other input terminals of each of the first-type tester are selectively coupled to k−1 different $Qr_{2j}$ data from the respective second processed data $(Qr_1 \sim Qr_{2n})$.

6. The method as claimed in claim 5, wherein the first-type tester is a NOR logic device, the second-type tester is a NAND logic device, and the second specific value is a logic value of "0".

7. The method as claimed in claim 5, wherein the signal lines outputting the second processed data $Qr_1 \sim Qr_{2n}$ are arranged sequentially;

every k−1 signal lines coupled to the data $Qr_{2a-1}$, $Qr_{2a+1}$, $Qr_{2a+3}$, $\sim Qr_{2a+2k-5}$ are extended and connected to the k−1 input terminals of the second-type tester (U2#a), where $1 \leq a \leq m$; every k−2 signal lines coupled to the data $Qr_{2a}$, $Qr_{2a+2}$, $Qr_{2a+4} \sim Qr_{2a+2k-6}$ are arranged sequentially between the corresponding signal lines coupled to the data $Qr_{2a-1}$, $Qr_{2a+1}$, $Qr_{2a+3} \sim Qr_{2a+2k-5}$, and extended toward the second-type tester (U2#a);

every k−1 signal lines coupled to the data $Qr_{2a}$, $Qr_{2a+2}$, $Qr_{2a+4}$, $\sim Qr_{2a+2k-4}$ are extended and connected to the k−1 input terminals of the first-type tester (U1#a); every k−2 signal lines coupled to the data $Qr_{2a+1}$, $Qr_{2a+3}$, $Qr_{2a+5} \sim Qr_{2a+2k-5}$ are arranged sequentially between the corresponding signal lines coupled to the data $Qr_{2a}$, $Qr_{2a+2}$, $Qr_{2a+4} \sim Qr_{2a+2k-4}$ and extended toward the first-type tester (U1#a).

8. The method as claimed in claim 1, wherein the digital-circuit portion refers to the internal data driver for driving the silicon wafer liquid crystal display of the reflection-type LCD projector, comprising at least: a shift register device, a sample register device, and a hold register device.

9. A method of testing a reflection-type LCD projector, focusing on testing the panel pixel area of a display of the silicon wafer liquid crystal of the projector, the display having M scan-lines with N pixels located on each of the scan-lines, comprising the steps of:

dividing the N pixels into K pixel groups;

providing a group-data parallel-in series-out device;

providing a first test pattern with a data length K, wherein the first test pattern is formed by outputting a first-type data and a second-type data alternately;

providing a second test pattern with a data length K, wherein the second test pattern is complementary to the first test pattern;

selecting one of the M scan-lines and writing the K data of the first test pattern into the K pixel groups respectively; wherein each pixel within the same pixel group has the same data, and the N pixel units located on the selected scan-line are written with the K data of the first test pattern;

inputting, in parallel, the data written into the N pixels to the group-data parallel-in series-out device; wherein the group-data parallel-in series-out device processes the data written into every pixel within each of the K pixel groups and outputs a first processed outcome with a data length K;

completing the data output of the first processed outcome, in series, after K time cycles;

writing the K data of the second test pattern into the K pixel groups respectively; where each pixel within the same pixel group has the same data, and the N pixels are written with the K data of the second test pattern;

inputting, in parallel, the data written into the N pixels to the group-data parallel-in series-out device; wherein the group-data parallel-in series-out device processes the data written into every pixel within each of the K pixel groups and outputs a second processed outcome with a data length K;

completing the data output of the second processed outcome, in series, after K time cycles;

repeating the above steps until all of the M scan-lines are tested completely;

wherein, when each of the M scan-lines is tested according the above steps, the first test pattern is contrasted with the first processed outcome while the second test pattern is contrasted with the second processed outcome in order to detect any damaged pixels.

10. The method as claimed in claim 9, wherein K NAND logic devices and K NOR logic devices are provided to the group-data parallel-in series-out device for processing each of the first test pattern and the second test pattern written into the K pixel groups respectively, in order to obtain the first processed outcome and the second processed outcome.

11. The method as claimed in claim 9, wherein at least K register devices ($R_1 \sim R_K$), connected in serial, are provided to the group-data parallel-in series-out device; wherein, when the first processed outcome, or the second processed outcome, are generated, the K data of the first processed outcome or the second processed outcome are inputted to the K register devices ($R_1 \sim R_K$) in parallel, and after the K data are inputted in parallel to the K register devices ($R_1 \sim R_K$), the K register devices ($R_1 \sim R_K$) function together as a shift register, thereby serially outputting the K data in the K register devices ($R_1 \sim R_K$), every clock cycle.

12. The method as claimed in claim 11, wherein a two-input multiplexing device and a D-type flip-flop is provided to compose each of the register devices ($R_1 \sim R_K$); wherein the first input of the two-input multiplexing device in the j-th register device ($R_j$), where $1 \leq j \leq K-1$, is coupled to the corresponding data output of the first processed outcome (or the second processed outcome), the output of the two-input multiplexing device in the j-th register device ($R_j$) is coupled, through the corresponding D-type flip-flop, to the second input of the two-input multiplexing device in the (j+1)-th register device ($R_{j+1}$); and the operations of the K register devices ($R_1 \sim R_K$), for receiving the first test pattern or the second test pattern in parallel and then serially outputting the first processed outcome or the second process outcome, are controlled via the each of the multiplexing devices in each of the K register devices.

13. The method as claimed in claim 9, wherein the first-type data has the logic value of "0", and the second-type data has the logic value of "1".

* * * * *